United States Patent
Langer et al.

(10) Patent No.: US 8,737,940 B1
(45) Date of Patent: May 27, 2014

(54) ENVELOPE TRACKING SYSTEM AND METHOD FOR CALIBRATING A SUPPLY VOLTAGE OF AN ENVELOPE TRACKING POWER AMPLIFIER

(71) Applicants: Andreas Langer, Lohhof (DE); Gunther Kraut, Egmating (DE); Berndt Pilgram, Munich (DE)

(72) Inventors: Andreas Langer, Lohhof (DE); Gunther Kraut, Egmating (DE); Berndt Pilgram, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/779,843

(22) Filed: Feb. 28, 2013

(51) Int. Cl.
*H01Q 11/12* (2006.01)
*H03G 3/20* (2006.01)

(52) U.S. Cl.
USPC ....................................... 455/127.1; 330/131

(58) Field of Classification Search
USPC ........................................ 455/127.1; 330/131
See application file for complete search history.

(56) References Cited

U.S. PATENT DOCUMENTS

| | | |
|---|---|---|
| 2012/0200354 A1 | 8/2012 | Ripley et al. |
| 2012/0200435 A1* | 8/2012 | Ngo et al. .................. 341/61 |
| 2012/0306572 A1 | 12/2012 | Hietala et al. |

* cited by examiner

*Primary Examiner* — Lee Nguyen
(74) *Attorney, Agent, or Firm* — Eschweiler & Associates, LLC (57) ABSTRACT

A method for calibrating a supply voltage of an envelope tracking PA (power amplifier) is provided. The method includes obtaining a plurality of calibrated PA supply voltage values using a PA output power sequence having a plurality of different PA output power values. Thereby, an order of the PA output power values of the PA output power sequence is chosen such that a junction temperature of the PA is maintained during calibration within a temperature range that occurs during non-calibration envelope tracking operation.

20 Claims, 8 Drawing Sheets

ENVELOPE TRACKING SYSTEM AND METHOD FOR CALIBRATING A SUPPLY VOLTAGE OF AN ENVELOPE TRACKING POWER AMPLIFIER

BACKGROUND

An efficient way to optimize a PA (PA=power amplifier) current consumption in a wireless system across an entire output power range is the use of a DCDC (DCDC=direct current to direct current) converter which provides a PA supply voltage. Depending on the output power, the output voltage of the DCDC converter is adjusted. The lower the output power is, the lower is the required PA supply voltage. Due to the voltage conversion from the battery voltage down to the lower PA supply voltage, the battery current is reduced. Conventionally, the DCDC converter output voltage is set based on a target power (average power) which is expected in a next slot. This procedure is called average power tracking (APT).

In future, fast DCDC converters, so called envelope tracking (ET) DCDC converters, will further reduce the battery current. Envelope tracking describes an approach for RF amplifier design in which the power supply voltage applied to the PA is constantly adjusted to ensure that the amplifier is operating at or close to peak efficiency for the given instantaneous output power requirements.

A feature of envelope tracking is that the supply voltage of the PA is not constant. The supply voltage of the PA depends on the instantaneous envelope of the modulated baseband signal or RF (RF=radio frequency) input signal, input into the PA. In a highly simplified description, the envelope of the modulated baseband signal is calculated by means of the CORDIC (CORDIC=coordinate rotation digital computer) algorithm, followed by a delay adjustment to compensate a different delay in the main signal path (RF signal generation path) and envelope path, then the envelope signal is shaped (pre-distorted) and finally digital-to-analog converted. This signal is applied to the envelope tracking DCDC converter (special ultra fast DCDC converter) which generates the variable power amplifier supply voltage.

An envelope tracking capable DCDC converter follows the instantaneous envelope of the RF signal which removes the voltage headroom and further increases the system efficiency (=composite efficiency of the power amplifier and the DCDC converter). It is expected that an envelope tracking capable DCDC converter will reduce the battery current of a LTE (LTE=long term evolution) signal by roughly 20+% at maximum output power relative to a standard DCDC converter which simply follows the average power.

To allow envelope tracking operation and to maximize the efficiency enhancement in an envelope tracking system the PA must be designed in a different way compared to a traditional PA design optimized for average power tracking.

SUMMARY

A method for calibrating a supply voltage of an envelope tracking PA (PA=power amplifier) is provided. The method comprises obtaining a plurality of calibrated PA supply voltage values using a PA output power sequence having a plurality of different PA output power values. Thereby, an order of the PA output power values of the PA output power sequence is chosen such that a junction temperature of the PA is maintained during calibration within a temperature range which occurs during non-calibration envelope tracking operation.

An envelope tracking system is provided. The envelope tracking system comprises an envelope tracking PA and a supply voltage provider. The supply voltage provider is configured to provide a supply voltage for the PA based on a current PA input power value and a plurality of calibrated PA supply voltage values. The plurality of calibrated PA supply voltage values are obtained using a PA output power sequence having a plurality of different PA output power values. Thereby, an order of the PA output power values of the PA output power sequence is chosen such that a junction temperature of the PA is maintained during calibration within a temperature range that occurs during non-calibration envelope tracking operation.

A mobile communication device is provided. The mobile communication device comprises an RF circuit configured to provide or receive RF signals and an antenna coupled to the RF circuit. The RF circuit comprises an envelope tracking system, comprising an envelope tracking PA and a supply voltage provider, wherein the supply voltage provider is configured to provide a supply voltage for the PA based on a current PA input power value and a plurality of calibrated PA supply voltage values. The plurality of calibrated PA supply voltage values are obtained using a PA output power sequence having a plurality of different PA output power values, wherein an order of the PA output power values of the PA output power sequence is chosen such that a junction temperature of the PA is maintained during calibration within a temperature range which occurs during non-calibration envelope tracking operation.

DETAILED DESCRIPTION

In the following description, equal or equivalent elements or elements with equal or equivalent functionality are denoted in the following description by equal or equivalent reference numerals.

Figure 1:
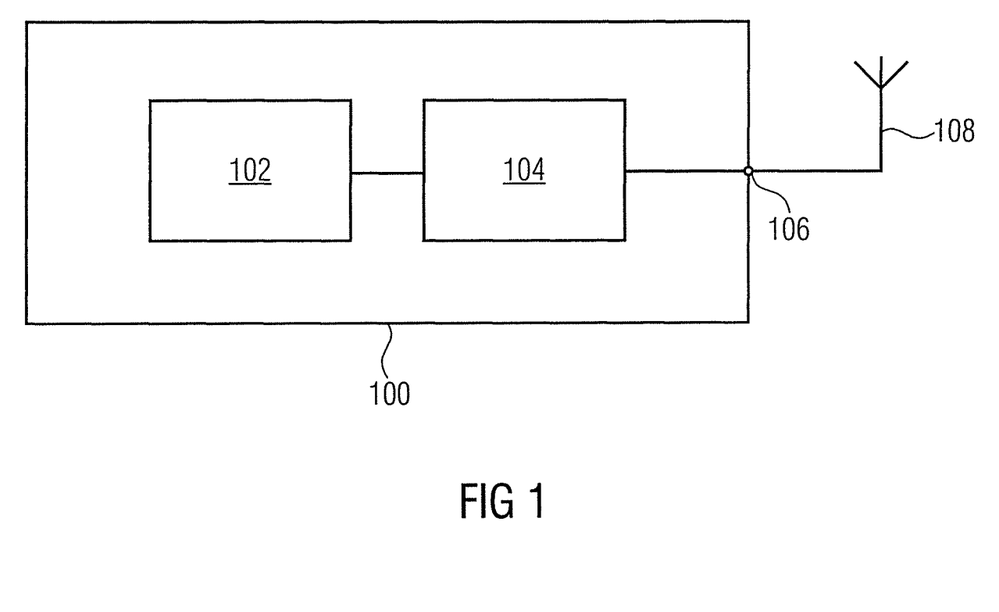
FIG. 1 shows a block diagram of an example mobile communication device.

FIG. 1 shows a block diagram of an example mobile communication device 100 comprising a digital baseband processor 102, an RF front end 104 coupled to the baseband processor 102 and to an antenna port 106. The antenna port 106 is provided to allow connection of an antenna 108 to the mobile communication device 100. The baseband processor 102 generates signals to be transmitted via the antenna 108 which are forwarded to the RF front end 104 generating a transmit signal output to the antenna port 106 for transmission via the antenna 108. The RF front end 104 may also receive signals via the antenna port 106 from the antenna 108 and provide respective signals to the baseband processor 102 for processing the received signals.

The envelope tracking system described in further detail below may be implemented in the RF front end 104. Moreover, the method for calibrating a supply voltage of an envelope tracking PA described in further detail below may be used to calibrate a supply voltage of an envelope tracking PA of the RF front end 104.

The mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

Figure 2:
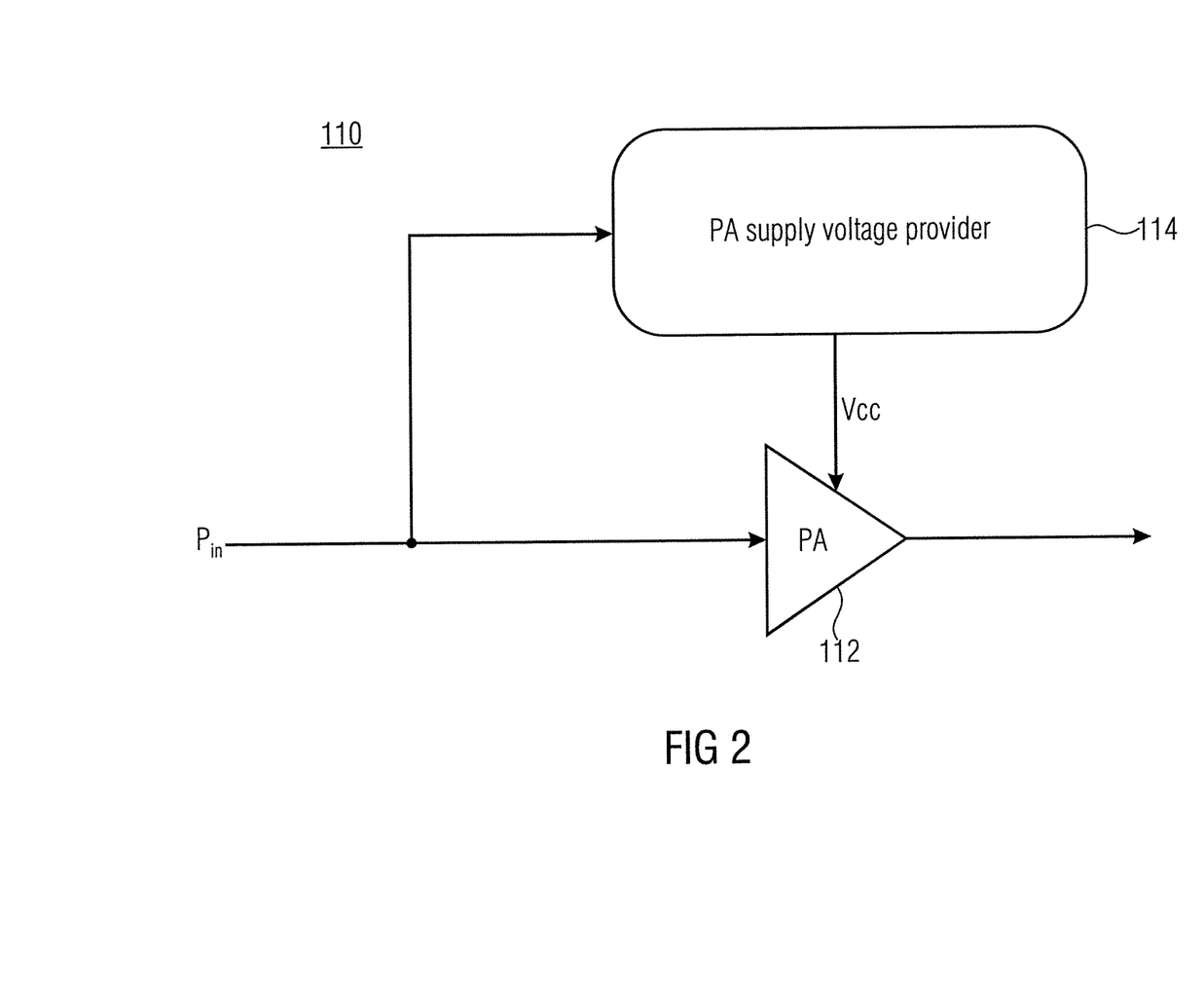
FIG. 2 shows a block diagram of an envelope tracking system.

FIG. 2 shows a block diagram of an envelope tracking system 110. The envelope tracking system 110 can comprise an envelope tracking PA 112 and a supply voltage provider 114 configured to provide a supply voltage Vcc for the PA 112 based on a current PA input power value Pin+.

To allow envelope tracking operation and to maximize efficiency enhancement in the envelope tracking system 110, the PA 112 is designed in a different way compared to a traditional PA design which is optimized for average power tracking.

For example, one important envelope tracking specific design target on system level is a flat AMPM- and AMAM (AM=amplitude modulation; PM=phase modulation) phase response of PA versus PA supply voltage Vcc and across output power (in this context, PA supply voltage Vcc means the voltage which is influenced by envelope tracking operation, for example, the supply voltage of the $2^{nd}$ PA stage). An envelope tracking friendly overall AMAM and/or AMPM characteristic can be achieved, for instance, if the PA supply voltage is pre-distorted. In this case, the PA supply voltage Vcc is not a simple linear response to the magnitude of the baseband (BB) envelope signal m(I,Q) (see FIG. 3). The PA supply voltage Vcc depends on the magnitude of the baseband envelope signal in a nonlinear way. The nonlinear shaping function is, for example, selected such that the PA gain is constant and becomes independent of the instantaneous PA supply voltage Vcc when the PA 112 operates in envelope tracking mode.

Figure 3:
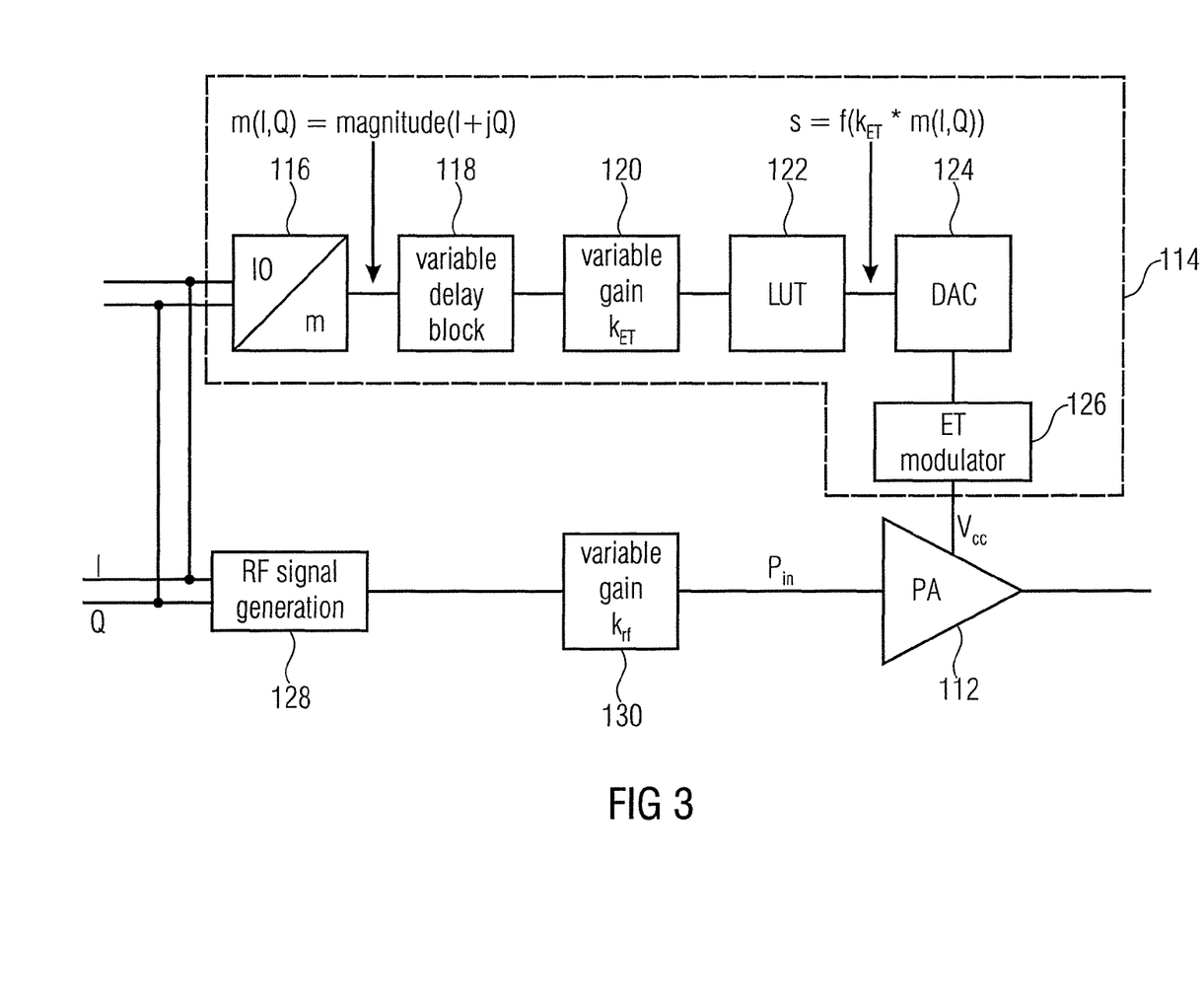
FIG. 3 shows a block diagram of an envelope tracking system having a lookup table for implementing a nonlinear transfer function.

FIG. 3 shows a block diagram of an example envelope tracking system 110. In contrast to FIG. 2, the PA supply voltage provider 114 can comprise a magnitude determiner 116, a variable delay unit 118, a variable gain unit 120, a lookup table (LUT) 122, a DAC 124 (DAC=digital-to-analog converter) and an envelope tracking modulator 126.

The magnitude determiner 116 can be configured to determine a magnitude of the baseband IQ signal (I=in-phase component; Q=quadrature component) in order to obtain the baseband envelope signal m(I,Q)=magnitude(I+jQ).

The variable gain unit 120 can be configured to adjust the amplitude of the baseband envelope signal m(I,Q) by the factor $k_{ET}$.

The lookup table 122 can be configured to provide a digital value "s" corresponding to the current envelope signal m(I,Q) based on the formula s=f($k_{ET}$*m(I,Q)).

Further, the envelope tracking system 110 can comprise an RF signal generation unit 128 and a variable gain unit 130.

The RF signal generation unit 128 can be configured to provide an RF signal for the PA 112 based on the baseband IQ signal.

The variable gain unit 130 can be configured to adjust the amplitude of the RF signal by the factor $k_{rf}$.

In FIG. 3, the nonlinear transfer function is realized by means of the lookup table (LUT) 122. Note that this is just an example for a nonlinear transfer function. The below described method for calibrating a supply voltage of an envelope tracking PA is not limited to lookup table 122 based implementations.

The transfer function which is realized here, by way of example, by means of a lookup table 122 is sensitive to part to part variation of the PA 112, the envelope tracking modulator 126 and/or the RF signal generation. As a result, the transfer function must be calibrated during production of the envelope tracking PA, of the envelope tracking system or of the wireless device.

One of many problems which might occur during factory calibration is the proper control of PA junction temperature when running the calibration sequence. During envelope tracking operation the temporal change of the envelope is much shorter than the thermal time constant of the PA 112. As a result, the junction temperature will not noticeably drop during an instantaneous low power phase and will not noticeably increase during an instantaneous peak power phase. As a result, the junction temperature is almost constant during envelope tracking operation. During calibration, the situation is different due to testing time which is much longer compared to the time the envelope changes. Since the actual output power must be measured and adjusted for a predefined number of target power levels (emulating the instantaneous power levels which occur during envelope tracking operation) the PA junction temperature will change depending on the actual output power and associated dissipated power and the time for taking a valid data point. However, it is important that the PA junction temperature is always close to the junction temperature effective later during normal envelope tracking operation, which e.g. occurs at maximum linear output power. This requirement is applicable to the entire output power range which is covered during calibration, e.g. at 5 dBm, but also at 30 dBm.

The reason why the quality of calibration is sensitive to temperature is the PA gain which strongly depends on its junction temperature. If the junction temperature varies during calibration, then a PA gain inaccuracy occurs which will introduce an error in the transfer function. If the transfer function is not correct, then undesired effects like ACLR (ACLR=adjacent channel leakage power ratio) degradation or increased noise in RX band will occur.

Figure 4:
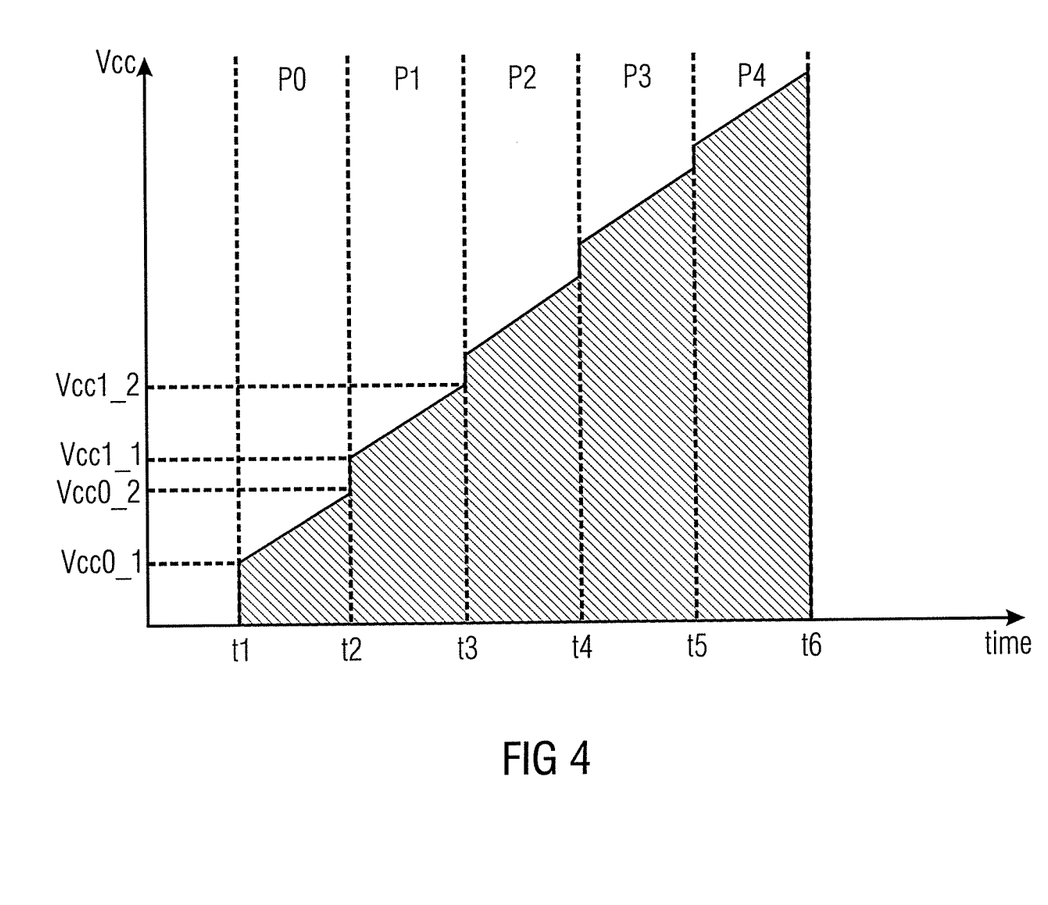
FIG. 4 shows in a diagram a potential calibration sequence that does not fulfill the isotherm constraint.

FIG. 4 shows in a diagram a potential calibration sequence which does not fulfill the isotherm constraint. In other words, FIG. 4 shows in a diagram a calibration sequence delivering inaccurate results. Thereby, the ordinate denotes the PA supply voltage Vcc, where the abscissa denotes the time.

As shown in FIG. 4, a PA output power sequence having a plurality of successively increasing PA output power values P0 to P4 can be used in order to obtain a plurality of calibrated PA supply voltage values Vcc0_2 to Vcc4_2.

As an example for a PA supply voltage Vcc criteria, it is assumed that the PA supply voltage Vcc shall be selected such that the PA gain is constant for each output power P0 to P4 (P0, P1, . . . , P4). The gain target shall be G_tar. The calibration procedure starts with a $0^{th}$ output power P0. Since the gain is constant, the corresponding input power is P0−G_tar. This input power is applied to the PA 112. The PA supply voltage Vcc is set to a predefined start value Vcc0_1. This start voltage Vcc0_1 results in a PA gain which is normally different from the gain target G_tar. The start values VccX_1 (in this example X=1, 2, . . . ,4 accounting for the different output power levels P0, P1, . . . , P4) are selected such that despite part-to-part variation over production the PA gain corresponding to VccX_1 at the power targets P0 to P4 (P0, P1, . . . , P4) is lower than the target gain. This guarantees that the target gain is captured when applying a rising PA supply voltage Vcc start value which results in a PA gain higher than the target gain and then applying a decreasing PA supply voltage Vcc sequence.

In the example according to FIG. 4, the PA supply voltage Vcc level starting from Vcc0_1 is increased for a constant input power P-G_tar until the target output power P0 is achieved. The corresponding Vcc level is called Vcc0_2. This voltage provides the desired gain G_tar at P0. Same procedure is repeated for P1 to P4 (P1, P2, . . . , P4). The time interval (e.g. t2-t1) for capturing the gain target G_tar depends on the actual PA gain at VccX_0. Thus, the time intervals are not necessarily equidistant.

The disadvantage is that the dissipated power monotonically increases from P0 to P4. Thus, the junction temperature at P4 will be much higher than junction temperature at P0 which will result in a gain error as pointed out above.

In the following, a method for calibrating a supply voltage Vcc of an envelope tracking PA 112 is described. Thereby, the method guarantees an almost constant temperature during calibration (isotherm calibration).

Figure 5:
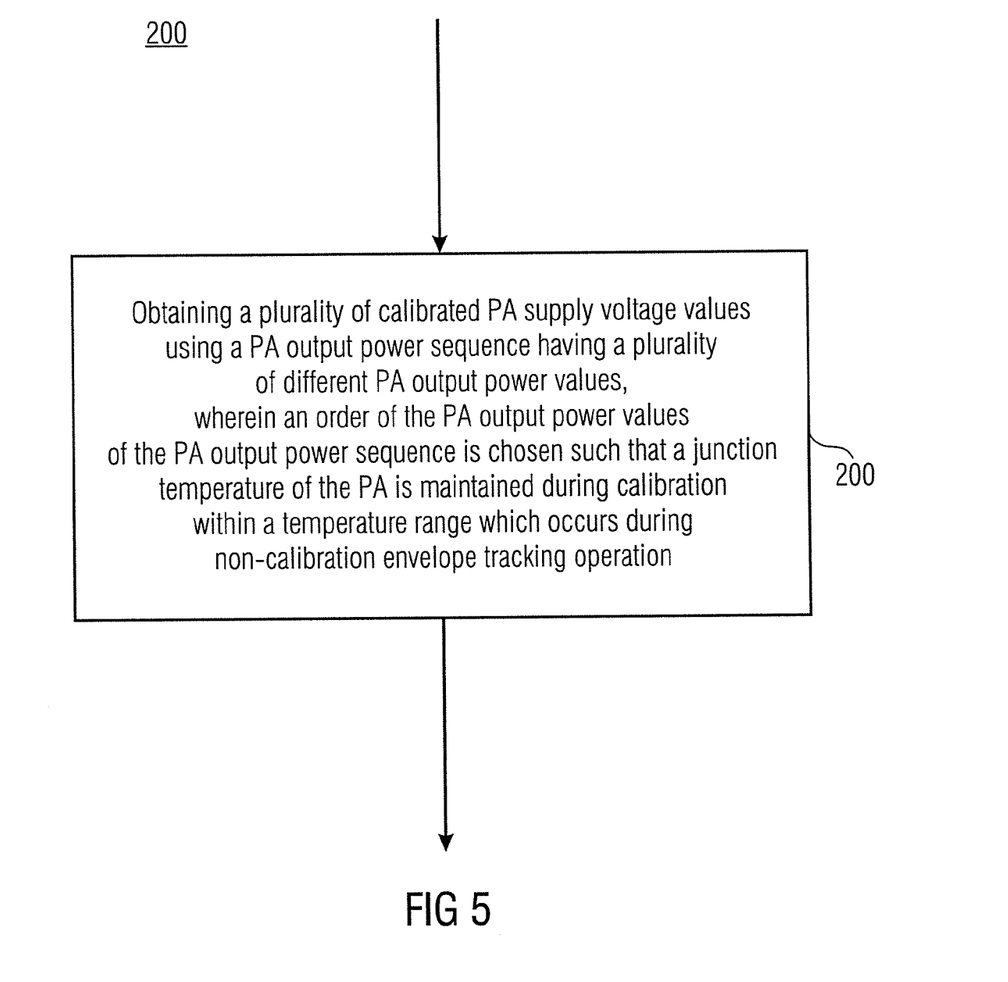
FIG. 5 shows a flowchart of a method for calibrating a supply voltage of an envelope tracking PA.

FIG. 5 shows a flowchart of a method 200 for calibrating a supply voltage Vcc of an envelope tracking PA 112. The method comprises, at 200, obtaining a plurality of calibrated PA supply voltage values Vcc0_2 to VccX_2 using a PA output power sequence having a plurality of different PA output power values P0 to PX. Thereby, an order of the PA output power values P0 to PX of the PA output power sequence is chosen such that a junction temperature of the PA 112 is maintained during calibration within a temperature range which occurs during non-calibration envelope tracking operation, e.g., normal envelope tracking operation.

Note that the PA output power sequence can comprise up to X+1 different PA output power values P0 to PX, wherein X is a natural number greater than or equal to two (X≥2).

For example, the PA output power sequence can comprise X+1=5 (or, 10, 20, 30, 40, 50, 60, 70, 100, 200, 300, 400, 500, 700, 1000 or even more) output power values P1 to PX.

Moreover, the output power values P0 to PX may successively increase, i.e. P0<P1<P2< . . . <PX-1<PX. However, the order of the PA output power values P0 to PX of the PA output power sequence is chosen such that the junction temperature of the PA 112 is maintained during calibration within a temperature range that occurs during non-calibration envelope tracking operation.

Figure 6:
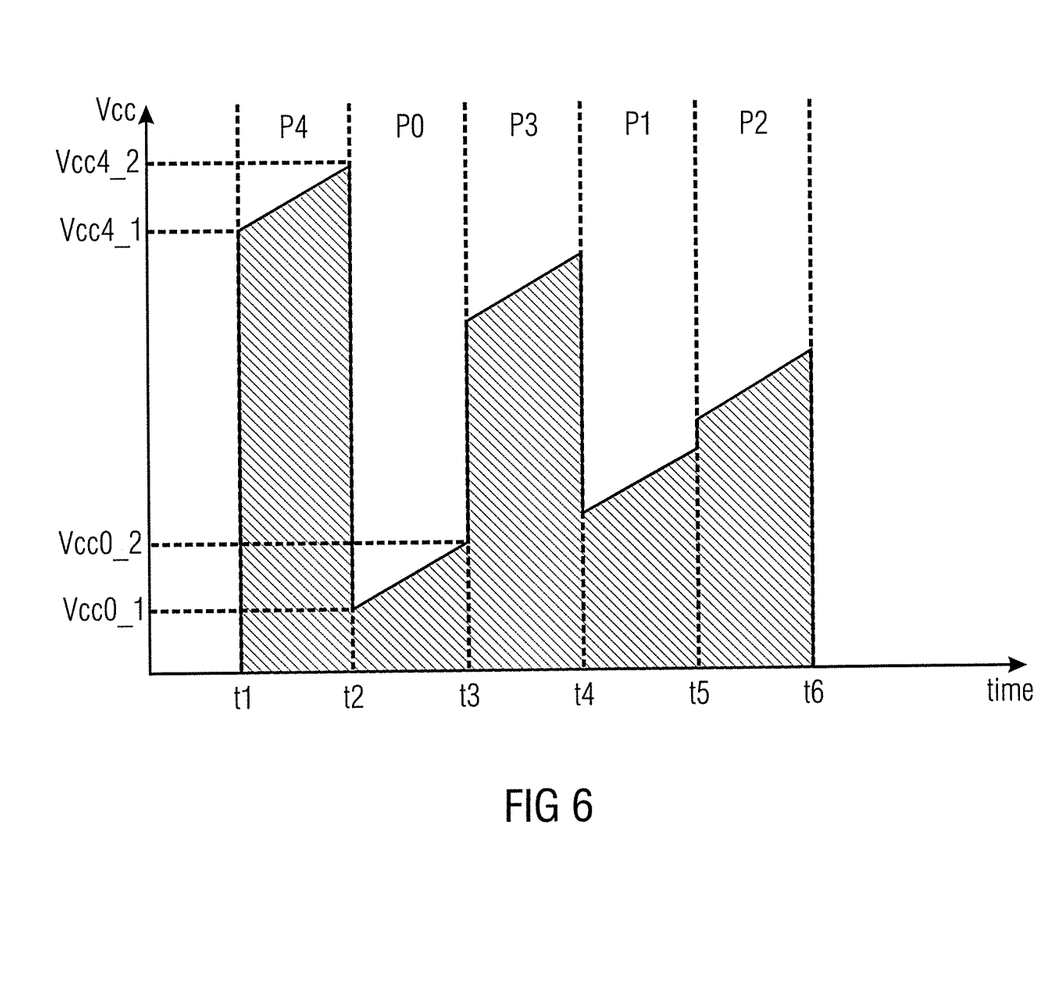
FIG. 6 shows in a diagram a course of a PA supply voltage plotted over time during calibrating the supply voltage of the envelope tracking PA.

FIG. 6 shows in a diagram a course of the PA supply voltage Vcc during calibrating the supply voltage of the envelope tracking PA 112 plotted over time.

As shown in FIG. 6, the order of the PA output power values P0 to PX (X=4) of the PA output power sequence is chosen such that the junction temperature of the PA 112 is maintained during calibration within a temperature range that occurs during non-calibration envelope tracking operation.

For example, referring to FIG. 6, the order of the output power values P0 to PX of the output power sequence is P4, P0, P3, P1, P2.

Moreover, each of the plurality of calibrated PA supply voltage values Vcc0_2 can be obtained by adjusting the supply voltage Vcc of the PA 112 until reaching a predefined range of the corresponding output power value.

Adjusting the supply voltage Vcc of the PA 112 can comprise increasing the supply voltage Vcc of the PA 112 starting from a PA supply voltage start value Vcc0_1 to VccX_1 which is expected to lead to a PA output power start value which is smaller than the corresponding PA output power value P0 to PX of the PA output power sequence.

Naturally, adjusting the supply voltage Vcc of the PA 112 may also comprise decreasing the supply voltage $V_{CC}$ of the PA 112 starting from a PA supply voltage start value Vcc0_1 to VccX_1 which is expected to lead to a PA output power start value which is greater than the corresponding PA output power value P0 to PX of the PA output power sequence.

Thereby, the PA supply voltage Vcc can be adjusted such that the predefined range of the corresponding output power value P0 to PX is reached within a time interval which is smaller than a thermal time constant of the PA 112.

The (total) calibration time for obtaining the plurality of calibrated PA supply voltage values Vcc0_2 to VccX_2 can be subdivided into calibration intervals, wherein in each calibration interval one calibrated PA supply voltage value of the PA supply voltage values Vcc0_2 to VccX_2 corresponding to one PA output power value of the PA output power values P0 to PX is obtained.

For example, referring to FIG. 6, in a first calibration time interval t2-t1 a fourth calibrated PA supply voltage value Vcc4_2 corresponding to a fourth PA output power value P4 can be obtained, wherein in a second calibration time interval t3-t2 a $0^{th}$ calibrated PA supply voltage value Vcc0_2 corresponding to a $0^{th}$ PA output power value P0 can be obtained.

Moreover, the order of the PA output power values P1 to PX of the PA output power sequence can be chosen such that the average dissipated powers over proper subsets of calibration intervals in which the calibrated PA supply voltage values Vcc2_0 to VccX_2 are obtained are within an average dissipated power range which occurs during non-calibration envelope tracking operation.

For example, a first proper subset of calibration intervals can comprise a first calibration interval t2-t1 and a second calibration interval t3-t2, and wherein a second proper subset of calibration intervals can comprise a third calibration interval t4-t3 and a fourth calibration interval t5-t4. Thereby, the order of the PA output power values P1 to PX (X=4) of the PA output power sequence can be chosen such that the average dissipated power in the first proper subset of calibration intervals and in the second proper subset of calibration intervals are within an average dissipated power range which occurs during non-calibration envelope tracking operation.

Note that the calibration intervals during which the calibrated PA supply voltage values Vcc0_2 to VccX_2 are obtained can be shorter than a thermal time constant of the PA 112.

In other words, the relevant difference to the afore-described procedure is the output power sequence. Instead of selecting a monotonic increasing (or decreasing) output power sequence, the sequence is selected such that the averaged dissipated power is closest to the average dissipated power which will occur during envelope tracking operation. The calibration intervals, e.g. t2-t1 can be shorter than the thermal time constant of the PA 112. If the length of a time interval is shorter than, e.g., 20 to 30 μs (or 10 to 40 μs, or 1 to 50 μs, or 0.5 to 100 μs), then the PA junction temperature cannot follow cooling and heating cycles caused by the different dissipated power in each calibration interval associated with the different power levels.

Figure 7:
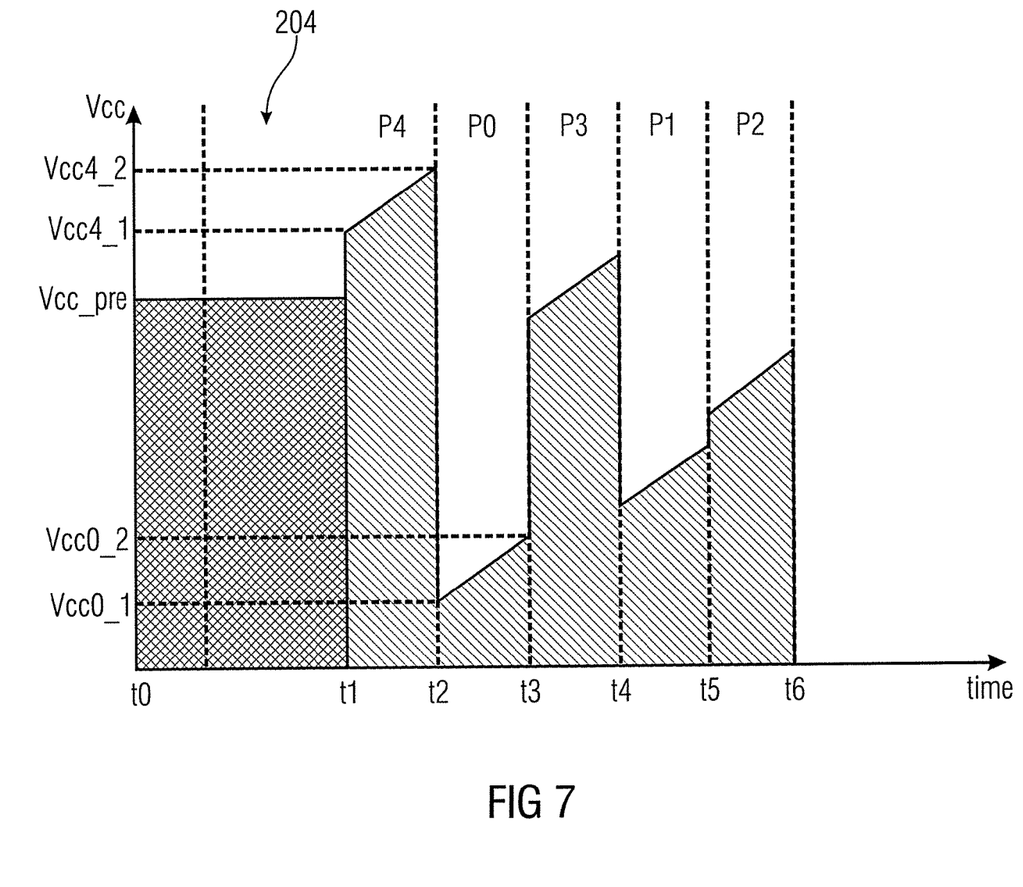
FIG. 7 shows in a diagram the course of the PA supply voltage plotted over time during calibrating the supply voltage of the envelope tracking PA.

FIG. 7 shows in a diagram a course of the PA supply voltage Vcc during calibrating the supply voltage of the envelope tracking PA 112 plotted over time.

As indicated in FIG. 7, the method 200 can further comprise pre-heating 204 the PA 112 before obtaining the plurality of calibrated PA supply voltage values Vcc0_2 to VccX_2 until reaching the temperature range which occurs during non-calibration envelope tracking operation.

For example, in a $0^{th}$ time interval t1–t0 a pre-heating PA supply voltage Vcc_pre can be applied to the envelope tracking PA 112 in order to pre-heat the PA 112.

Pre-heating 204 the PA 112 can comprise operating the PA 112 under a PA output power which is constant or within a PA output power range which occurs during non-calibration envelope tracking operation, in order to obtain the temperature range which occurs during non-calibration envelope tracking operation.

In other words, as a further improvement it is proposed to start the calibration with a preheating phase 204 as depicted in FIG. 7. This preheating phase 204 can generate a PA junction temperature which is closest to the temperature which occurs in envelope tracking operation. Due to the preheating phase 204, the calibration starts with the correct junction temperature.

Furthermore, the method 200 can comprise varying durations of calibration intervals in which the calibrated PA supply voltage values Vcc0_2 to VccX_2 are obtained such that the junction temperature of the PA 112 is maintained during calibration within the temperature range which occurs during non-calibration envelope tracking operation.

Thereby, the durations of the calibration intervals can be varied such that an average dissipated power over a proper subset of calibration intervals is within an average dissipated power range which occurs during non-calibration envelope tracking operation.

In other words, in a further improvement it is proposed to vary the duration of the calibration intervals. This effort is done to refine the average dissipation over a certain number of calibration intervals.

The method 200 can comprise storing the plurality of obtained calibrated PA supply voltage values Vcc0_2 to VccX_2 or an information derived therefrom in a digital storage element.

Further, the plurality of obtained calibrated PA supply voltage values Vcc0_2 to VccX_2 or the information derived therefrom can be stored in association with an information describing at least one of the corresponding PA output power values P0 to PX and PA input power values.

Figure 8:
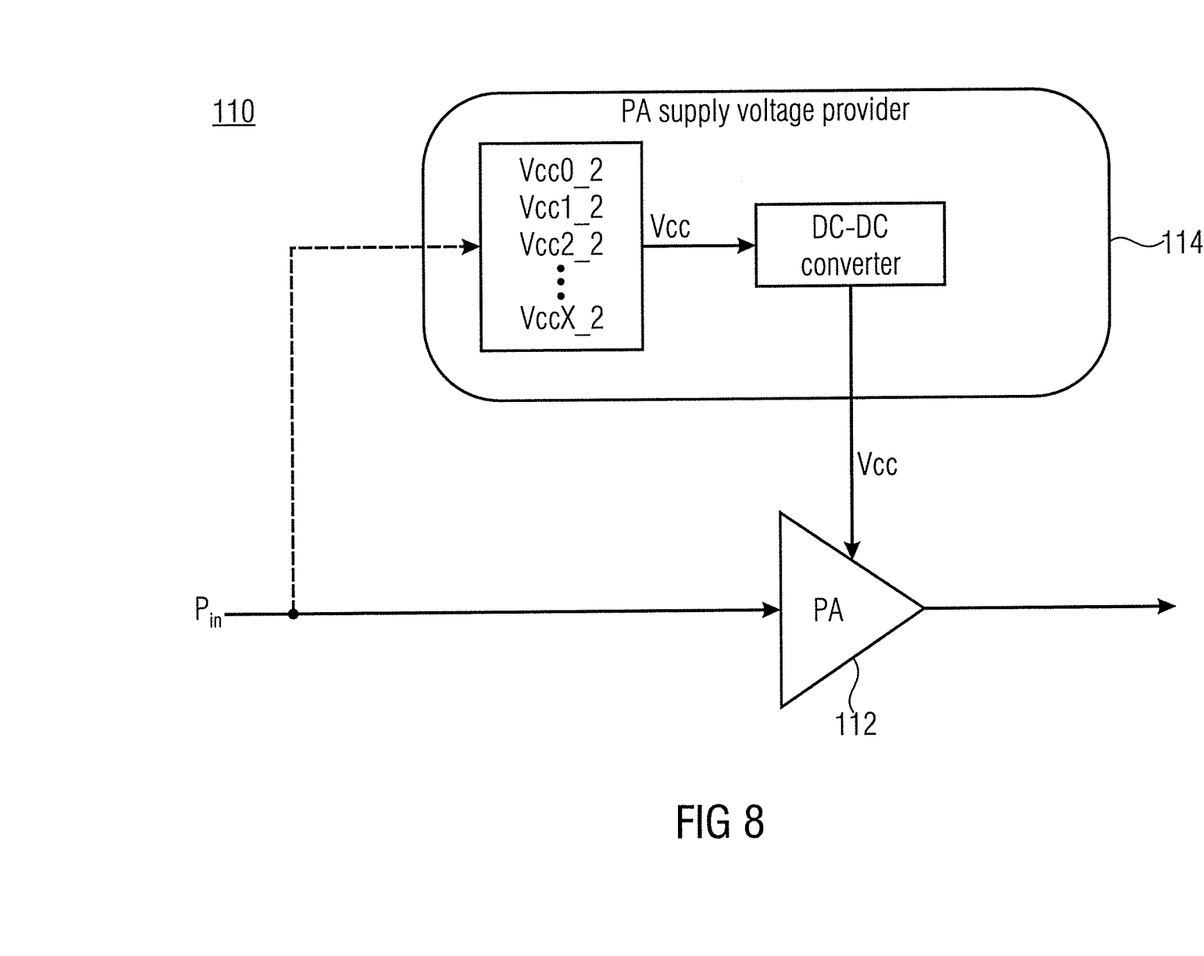
FIG. 8 shows a block diagram of an envelope tracking system.

FIG. 8 shows a block diagram of an envelope tracking system 110. The envelope tracking system 110 comprises an envelope tracking PA 112 and a supply voltage provider 114. The supply voltage provider 114 can be configured to provide a supply voltage $V_{cc}$ for the PA 112 based on a current PA input power value Pin and a plurality of calibrated PA supply voltage values Vcc0_2 to VccX_2, wherein the plurality of calibrated PA supply voltage values Vcc0_2 to VccX_2 were obtained using a PA output power sequence having a plurality of different PA output power values P0 to PX, and wherein an order of the PA output power values P0 to PX of the PA output power sequence was chosen such that a junction temperature of the PA 112 was maintained during calibration within a temperature range that occurs during non-calibration envelope tracking operation.

As indicated in FIG. 8, the supply voltage provider 114 can comprise a DCDC converter 140 configured to provide the supply voltage Vcc for the PA 112 based on a calibrated PA supply voltage value of the plurality of calibrated PA supply voltage values Vcc0_2 to VccX_2 corresponding to the current PA input power value Pin.

Furthermore, the supply voltage provider 114 can comprise a digital storage element 142 having stored thereon the plurality of calibrated PA supply voltage values Vcc0_2 to VccX_2.

Thereby, the plurality of calibrated PA supply voltage values Vcc0_2 to VccX_2 can be stored on the digital storage element 142 in association with an information describing the corresponding PA input power values, wherein the digital storage element is configured to provide in response to the current PA input power value Pin a calibrated PA supply voltage value of the plurality of calibrated PA supply voltage values Vcc0_2 to VccX_2 corresponding to the current PA input power value Pin.

For example, the digital storage element 142 can be implemented by means of a lookup table.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method acts may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier that is non-transitory.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A method for calibrating a supply voltage of an envelope tracking power amplifier (PA), comprising:
   ordering a plurality of different PA output power values to form a PA output power sequence; and
   obtaining a plurality of calibrated PA supply voltage values using the PA output power sequence having the plurality of different PA output power values;
   wherein an order of the PA output power values of the PA output power sequence is chosen such that a junction temperature of the PA is maintained during calibration within a temperature range that occurs during non-calibration envelope tracking operation.

2. The method according to claim 1, wherein the order of the PA output power values of the PA output power sequence is chosen such that average dissipated powers over proper subsets of calibration intervals in which the calibrated PA supply voltage values are obtained are within an average dissipated power range that occurs during non-calibration envelope tracking operation.

3. The method according to claim 1, wherein the method further comprises pre-heating the PA before obtaining the plurality of calibrated PA supply voltage values until reaching the temperature range which occurs during non-calibration envelope tracking operation.

4. The method according to claim 3, wherein pre-heating the PA comprises operating the PA under a PA output power that is constant or within a PA output power range that occurs during non-calibration envelope tracking operation, in order to obtain the temperature range that occurs during non-calibration envelope tracking operation.

5. The method according to claim 1, wherein the method comprises varying durations of one or more calibration intervals in which the calibrated PA supply voltage values are obtained such that the junction temperature of the PA is maintained during calibration within the temperature range that occurs during non-calibration envelope tracking operation.

6. The method according to claim 5, wherein the durations of the one or more calibration intervals are varied such that an average dissipated power over a proper subset of calibration intervals is within an average dissipated power range that occurs during non-calibration envelope tracking operation.

7. The method according to claim 1, wherein calibration intervals during which the calibrated PA supply voltage values are obtained are shorter than a thermal time constant of the PA.

8. The method according to claim 1, further comprising storing the plurality of obtained calibrated PA supply voltage values or an information derived therefrom in a digital storage element.

9. The method according to claim 8, wherein the plurality of obtained calibrated PA supply voltage values or the information derived therefrom is stored in association with an information describing at least one of the corresponding PA output power values and PA input power values.

10. The method according to claim 1, wherein each of the plurality of calibrated PA supply voltage values is obtained by adjusting the supply voltage of the power amplifier until reaching a predefined range of the corresponding output power value.

11. The method according to claim 10, wherein the PA supply voltage is adjusted such that the predefined range of the corresponding output power value is reached within a time interval that is smaller than a thermal time constant of the PA.

12. The method according to claim 10, wherein adjusting the supply voltage of the PA comprises increasing the supply voltage of the PA starting from a PA supply voltage start value that is expected to lead to a PA output power start value that is smaller than the corresponding PA output power value of the PA output power sequence.

13. The method according to claim 10, wherein adjusting the supply voltage of the PA comprises decreasing the supply voltage of the PA starting from a PA supply voltage start value that is expected to lead to a PA output power start value that is greater than the corresponding PA output power value of the PA output power sequence.

14. A method for calibrating a supply voltage of an envelope tracking power amplifier (PA), wherein the method comprises:
obtaining a plurality of calibrated PA supply voltage values using a PA output power sequence having a plurality of different PA output power values, wherein each of the plurality of calibrated PA supply voltage values is obtained by adjusting the supply voltage of the power amplifier until reaching a predefined range of the corresponding output power value; and
storing the plurality of obtained calibrated PA supply voltage values or an information derived therefrom in a digital storage element;
wherein an order of the PA output power values of the PA output power sequence is chosen such that a junction temperature of the PA is maintained during calibration within a temperature range that occurs during non-calibration envelope tracking operation; and
wherein calibration time intervals in which the calibrated PA supply voltage values are obtained are shorter than a thermal time constant of the PA.

15. An envelope tracking system, comprising:
an envelope tracking power amplifier (PA); and
a supply voltage provider configured to provide a supply voltage for the PA based on a current PA input power value and a plurality of calibrated PA supply voltage values;
wherein the plurality of calibrated PA supply voltage values are obtained using a PA output power sequence having a plurality of different PA output power values; and
wherein an order of the PA output power values of the PA output power sequence is chosen such that a junction temperature of the PA is maintained during calibration within a temperature range that occurs during non-calibration envelope tracking operation.

16. The envelope tracking system according to claim 15, wherein the supply voltage provider comprises a DCDC converter configured to provide the supply voltage for the PA based on a calibrated PA supply voltage value of the plurality of calibrated PA supply voltage values corresponding to the current PA input power value.

17. The envelope tracking system according to claim 15, wherein the supply voltage provider comprises a digital storage element having stored therein the plurality of calibrated PA supply voltage values.

18. The envelope tracking system according to claim 17, wherein the plurality of calibrated PA supply voltage values are stored in the digital storage element in association with an information describing the corresponding PA input power values, wherein the digital storage element is configured to provide in response to the current PA input power value a calibrated PA supply voltage value of the plurality of calibrated PA supply voltage values corresponding to the current PA input power value.

19. An envelope tracking system, comprising:
an envelope tracking power amplifier (PA);
a lookup table having stored a plurality of calibrated PA supply voltage values in association with an information describing corresponding PA input power values, wherein the lookup table is configured to provide in response to a current PA input power value a calibrated PA supply voltage value of the plurality of calibrated PA supply voltage values corresponding to the current PA input power value; and
a DCDC converter configured to provide the supply voltage for the PA based on the calibrated PA supply voltage value provided by the lookup table;
wherein the plurality of calibrated PA supply voltage values are obtained using a PA output power sequence having a plurality of different PA output power values; and wherein an order of the PA output power values of the PA output power sequence is chosen such that a junction temperature of the PA is maintained during calibration within a temperature range that occurs during non-calibration envelope tracking operation.

20. A mobile communication device, comprising:

an RF circuit configured to provide or receive RF signals; and an antenna port coupled to the RF circuit;

wherein the RF circuit comprises an envelope tracking system, comprising an envelope tracking PA and a supply voltage provider, wherein the supply voltage provider is configured to provide a supply voltage for the PA based a current PA input power value and a plurality of calibrated PA supply voltage values;

wherein the plurality of calibrated PA supply voltage values are obtained using a PA output power sequence having a plurality of different PA output power values; and wherein an order of the PA output power values of the PA output power sequence is chosen such that a junction temperature of the PA is maintained during calibration within a temperature range that occurs during non-calibration envelope tracking operation.

* * * * *